US012793203B2

(12) United States Patent
Brauer

(10) Patent No.: US 12,793,203 B2
(45) Date of Patent: Nov. 10, 2026

(54) WAFER ALIGNMENT IMPROVEMENT THROUGH IMAGE PROJECTION-BASED PATCH-TO-DESIGN ALIGNMENT

(71) Applicant: KLA Corporation, Milpitas, CA (US)

(72) Inventor: Bjorn Brauer, Beaverton, OR (US)

(73) Assignee: KLA Corporation, Milpitas, CA (US)

( * ) Notice: Subject to any disclaimer, the term of this patent is extended or adjusted under 35 U.S.C. 154(b) by 224 days.

(21) Appl. No.: 17/466,703

(22) Filed: Sep. 3, 2021

(65) Prior Publication Data

US 2023/0075297 A1 Mar. 9, 2023

(51) Int. Cl.

| | |
|---|---|
| ***G06T 7/32*** | (2017.01) |
| ***G06T 7/00*** | (2017.01) |
| ***G06T 7/70*** | (2017.01) |
| ***H10P 72/50*** | (2026.01) |
| ***H10P 74/20*** | (2026.01) |

(52) U.S. Cl.

CPC ................ *G06T 7/001* (2013.01); *G06T 7/32* (2017.01); *G06T 7/70* (2017.01); *H10P 72/53* (2026.01); *H10P 74/203* (2026.01); *G06T 2207/30148* (2013.01)

(58) Field of Classification Search

CPC .. G06T 7/001; G06T 7/32; G06T 7/70; G06T 2207/30148; H01L 21/681; H01L 22/12

See application file for complete search history.

(56) References Cited

U.S. PATENT DOCUMENTS 5,640,200 A * 6/1997 Michael .................. G06T 7/001 382/160
6,292,582 B1 * 9/2001 Lin .................. G01N 21/95607 257/E23.179
2006/0038987 A1 * 2/2006 Maeda ............. G01N 21/95607 356/237.5
2007/0288219 A1 * 12/2007 Zafar ........................ G03F 1/84 703/14
2014/0233816 A1 * 8/2014 Cheng ....................... G06T 5/50 382/129
2016/0300338 A1 * 10/2016 Zafar ...................... G06F 18/22
2018/0197285 A1 * 7/2018 Vinciguerra ............ G06T 7/001
2018/0232873 A1 * 8/2018 Inoue ...................... G06T 7/001
2019/0139208 A1 5/2019 Chen et al.

(Continued)

FOREIGN PATENT DOCUMENTS

CN 112292753 A 1/2021
CN 112348863 A 2/2021
WO 2021154765 A1 8/2021

OTHER PUBLICATIONS

"Kenneth R. Spring, Brightness and Contrast in Digital Images, n.d., Evident, Interactive Knowledge HUB, all pages"; 2025.*

(Continued)

*Primary Examiner* — Jonathan S Lee
*Assistant Examiner* — D J Dhooge
(74) *Attorney, Agent, or Firm* — Hodgson Russ LLP

(57) ABSTRACT

Image alignment or image-to-design alignment can be improved using normalized cross-correlation. A setup image to a runtime image are aligned and a normalized cross-correlation scores is determined. Image projections for the images can be determined and aligned in the perpendicular x and y directions. Alignment of the image projections can include finding projection peak locations and adjusting the projection peak locations in the x and y directions.

16 Claims, 4 Drawing Sheets

(56) References Cited

U.S. PATENT DOCUMENTS

| | | | | |
|---|---|---|---|---|
| 2020/0388001 | A1 | 12/2020 | Lee | |
| 2021/0097704 | A1 | 4/2021 | Brauer et al. | |
| 2021/0174483 | A1* | 6/2021 | Zhang | G01N 21/9501 |
| 2021/0217159 | A1 | 7/2021 | Jiang et al. | |
| 2022/0101506 | A1* | 3/2022 | Jiang | G06T 7/74 |
| 2023/0005242 | A1* | 1/2023 | Song | G06T 7/74 |

OTHER PUBLICATIONS

WIPO, ISR for International Application No. PCT/US2021/050766, May 30, 2022.

CNIPA, Office Action issued in CN Application No. 202180098550. X, Nov. 2, 2024.

* cited by examiner

WAFER ALIGNMENT IMPROVEMENT THROUGH IMAGE PROJECTION-BASED PATCH-TO-DESIGN ALIGNMENT

FIELD OF THE DISCLOSURE

This disclosure relates to imaging semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Patch-to-design alignment (PDA) can be used during inspection. An entire wafer may be scanned during setup to find 2D unique targets that are evenly distributed across a die. A design is acquired for each of these targets. Image rendering parameters can be learned from example targets and an image can be rendered from the design at each target. This rendered image can be aligned to the optical image at each target. Design and image offsets can be determined from the targets for each inspection frame. The targets and offsets are saved to a database.

During runtime, the setup image is aligned to a runtime image at each target because it can be more accurate to align a real optical image to another optical image. Offsets between the setup and runtime images are determined for each inspection frame. Offsets between the design and runtime image are determined for each inspection frame. Care areas can then be placed according to offset correction.

Alignment or other aspects of PDA can be negatively impacted by process variation, which can lower PDA performance. Improved techniques and systems are needed.

BRIEF SUMMARY OF THE DISCLOSURE

A method is provided in a first embodiment. The method includes aligning a setup image to a runtime image at a target using a processor thereby generating aligned images. Using the processor, a normalized cross-correlation score is determined for the aligned images. The normalized cross-correlation score for the aligned images can be below a threshold. Using the processor, an image projection in perpendicular x and y directions is determined for polygons in the aligned images. Using the processor, the image projections for the setup image and the runtime image are aligned.

The method can further include determining offsets between the setup image and the runtime image for an inspection frame after aligning the image projections. Offsets between a design and the runtime image for the inspection frame also can be determined. Care areas can be placed based on an offset correction.

Aligning the image projections can include: determining projection peak locations for the polygons in the aligned images along the x direction; adjusting the runtime image and/or the setup image so the projection peak locations overlap along the x direction; determining projection peak locations for the polygons in the aligned images along the y direction; and adjusting the runtime image and/or the setup image so the projection peak locations overlap along the y direction.

A system is provided in a second embodiment. The system includes a stage configured to hold a semiconductor wafer; an energy source configured to direct a beam at the semiconductor wafer on the stage; a detector configured to receive the beam reflected from the semiconductor wafer on the stage; and a processor in electronic communication with the detector. The energy source can be a light source. The beam can be a beam of light. The processor is configured to: align a setup image to a runtime image at a target thereby generating aligned images; determine a normalized cross-correlation score for the aligned images; determine an image projection in perpendicular x and y directions for polygons in the aligned images; and align the image projections for the setup image and the runtime image. The normalized cross-correlation score for the aligned images can be below a threshold.

The processor can be further configured to determine offsets between the setup image and the runtime image for an inspection frame after the image projections are aligned. The processor can be further configured to determine offsets between a design and the runtime image for the inspection frame. The processor can be further configured to place care areas based on an offset correction.

Aligning the image projections can include: determining projection peak locations for the polygons in the aligned images along the x direction; adjusting the runtime image and/or the setup image so the projection peak locations overlap along the x direction; determining projection peak locations for the polygons in the aligned images along the y direction; and adjusting the runtime image and/or the setup image so the projection peak locations overlap along the y direction.

A non-transitory computer-readable storage medium is provided in a third embodiment. The non-transitory computer-readable storage medium comprises one or more programs for executing the following steps on one or more computing devices. The steps include aligning a setup image to a runtime image at a target thereby generating aligned images; determining a normalized cross-correlation score for the aligned images; determining an image projection in perpendicular x and y directions for polygons in the aligned images; and aligning the image projections for the setup image and the runtime image. The normalized cross-correlation score for the aligned image can be below a threshold.

The steps can further include determining offsets between the setup image and the runtime image for an inspection frame after aligning the image projections. The steps can further include determining offsets between a design and the runtime image for the inspection frame. The steps can further include placing care areas based on an offset correction using the processor.

The steps can further include: determining projection peak locations for the polygons in the aligned images along the x direction; adjusting the runtime image and/or the setup image so the projection peak locations overlap along the x direction; determining projection peak locations for the polygons in the aligned images along the y direction; and adjusting the runtime image and/or the setup image so the projection peak locations overlap along the y direction.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein improve the stability of PDA by adding a projection-based alignment step during runtime. Fewer PDA alignment targets may fail alignment using techniques disclosed herein. This also can avoid making incorrect processing decisions caused by poor alignment. The embodiments disclosed herein can be particularly useful for low-contrast images or images that are difficult to align, such as with memory devices.

Figure 1:
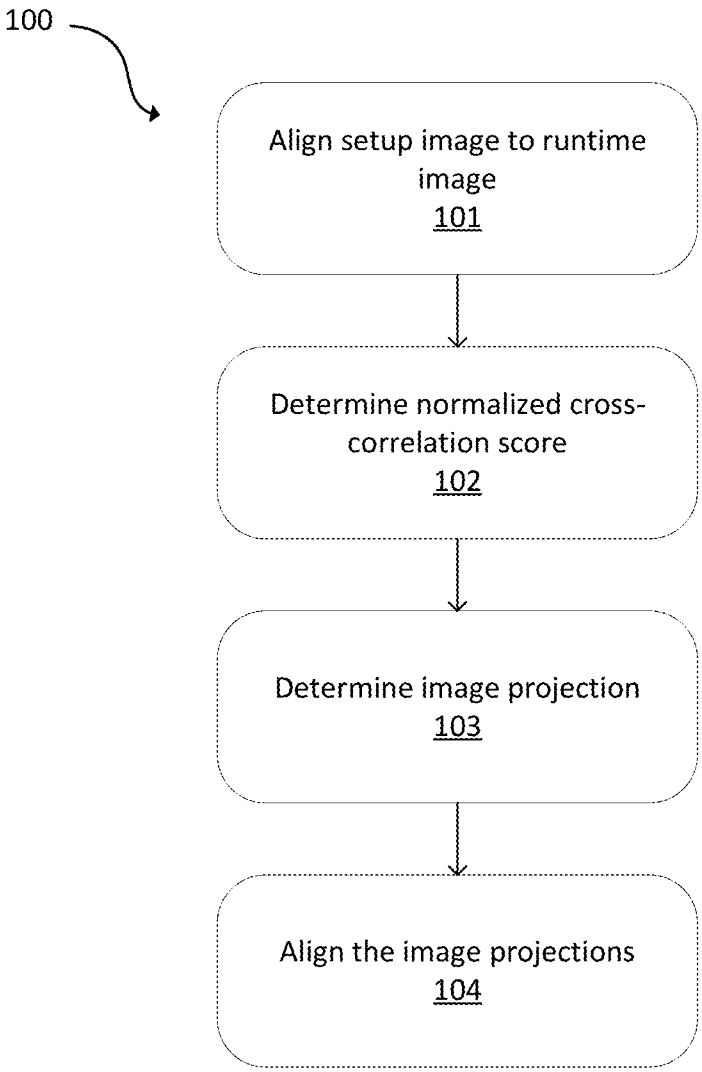
FIG. 1 is a flowchart of a method in accordance with the present disclosure.

FIG. 1 is a flowchart of a method 100. Some or all of the steps of the method 100 can be performed by a processor.

At 101, a setup image is aligned to a runtime image at a target. Later steps, such as defect attribute determination, can use the aligned images. Alignment also can affect defect location coordinate accuracy. The target in step 101 can be a target image printed on a wafer or other structures. The images can be from 128×128 pixels to 1024×1024 pixels, though other sizes are possible. The aligned images can be overlaid in an instance.

Figure 3:
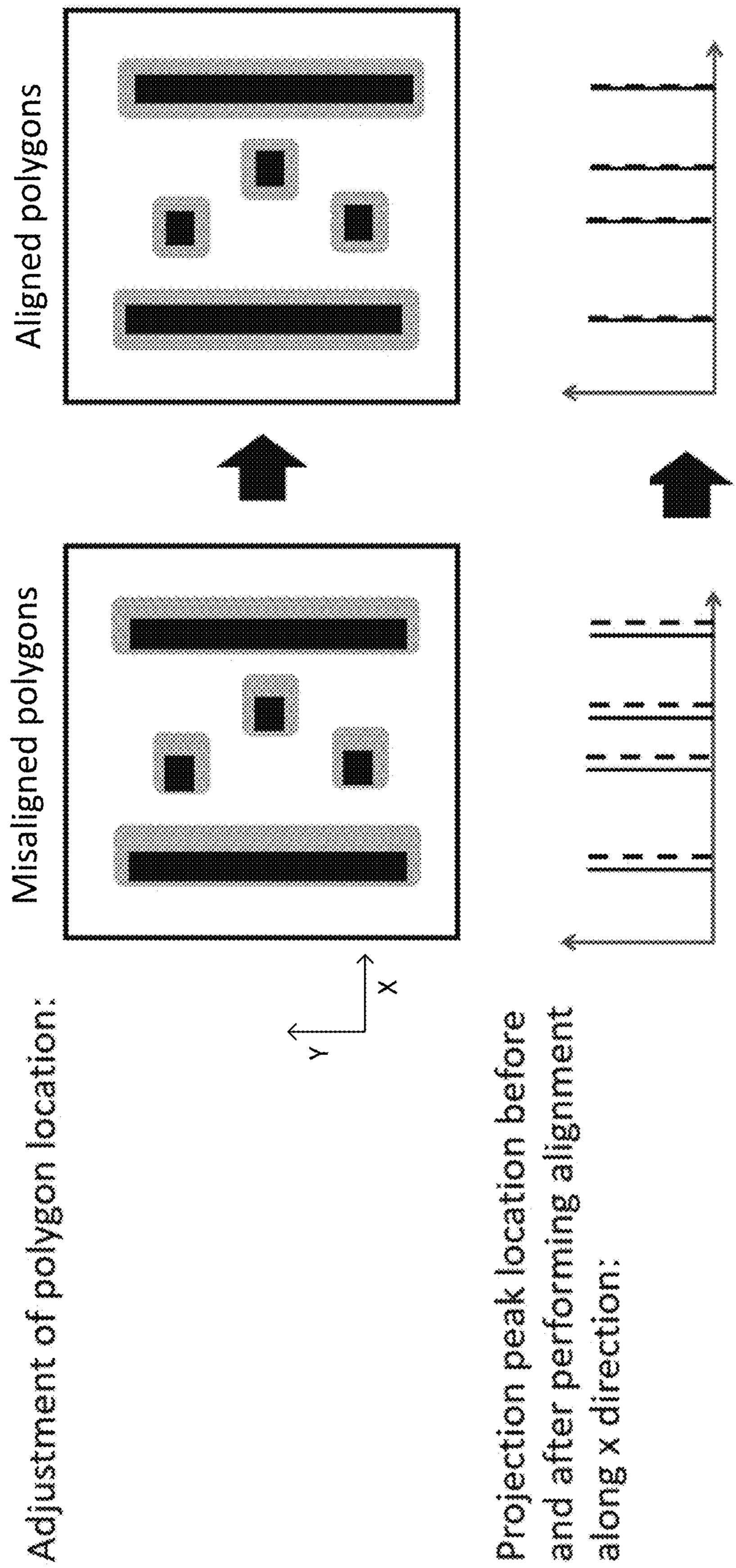
FIG. 3 is an example of adjusting polygon locations.

In an example, the setup image is a golden image from a golden wafer or another reference image. The runtime image is an image generated during inspection. This generates aligned images. An example of a setup image aligned to a runtime image is shown in the left example of FIG. 3. FIG. 3 shows the polygons of the two images as black and grey, respectively. Note that the polygons in the left example of FIG. 3 are not aligned properly.

Turning back to FIG. 1, a normalized cross-correlation (NCC) score is determined for the aligned images at 102. Cross-correlation is a measure of similarity of two types of data as a function of the displacement of one relative to the other. NCC is a technique that can be used to compare two images. A low NCC score indicates that alignment is poor between the two images.

For continuous functions f and g, cross-correlation can be defined as follows.

$$(f \star g)(\tau) \triangleq \int_{-\infty}^{\infty} \overline{f(t)} g(t+\tau) dt$$

$\overline{f(t)}$ denotes the complex conjugate of f(t). τ is the displacement (or lag) showing that a feature in fat t occurs in g at t+τ.

If the NCC scores for the aligned images is above a threshold, then steps 103 and 104 are not performed. The threshold can be determined from experimental data, such that the threshold can provide a desired NCC score for a type of image. If the NCC score for the aligned images is below a threshold, then an image projection is determined at 103. The image projection can be in perpendicular x and y directions for polygons on the aligned images.

The images used in the NCC score are independent of each other (i.e., are not merged). Cross-correlation is used to measure similarity. A projection technique can be used if the images are not similar enough for later processing.

Image projection is a sum of grey level values along a column or row of the image. This can use the following formula.

$$p_j = \frac{1}{n} \sum_{i=1}^{n} a_{ij}$$

$a_{ij}$ is the i-th, j-th element of the image matrix. The projection adds all the pixels along a certain column or row and divides it by the number of pixels in such a column or row, respectively. The projection values $p_j$ are plotted over the pixel number. This provides the projection plot for all the columns j. A similar process can be performed for all the rows i.

For example, the image projection sums are shown in the charts below the example images in FIG. 3 using the solid and dotted lines on the chart. In FIG. 3, a row may be equal to a pixel. Often, the pixels are squares so their size in the x and y direction are the same. The image frames themselves also may be squares. The image projection can be a numerical value across, for example, the perpendicular x and y directions of an image.

A potential image rotation angle between two images is typically low (e.g., below 1 degree). Such rotations can manifest themselves as vertical shifts. The actual rotation of the image may not be relevant because it is typically less than one degree.

Turning back to FIG. 1, image projections for the setup image and the runtime image are aligned at 104. This can include determining a projection peak location for polygons in the image along the x direction and along the y direction. The image can be adjusted so the projection peak locations overlap along the x direction and/or y direction. Such offset correction is shown at the bottom of FIG. 3, which aligns the two projection maxima and minima. The maxima and minima in the projection peaks at the bottom of FIG. 3 correspond to the images above them for the misaligned polygons and the aligned polygons. A solid line in FIG. 3 is the center of the projection of the black-shaded structure. The broken line is the center of the projection of the grey-shaded structure.

Typically, moving the row can equate to moving the pixels. A row can be equal to a pixel or the row can be configured to correspond to a group of pixels. This is illustrated in the example of FIG. 3. Only the x-projection is illustrated in FIG. 3, but the same technique can be performed in the perpendicular y-projection. Offset correction can be used in the x direction or y direction to shift the polygons by adjusting the image so that the maximums and/or minimums in the image projections overlap. If overlap is not possible, then the polygons can be shifted to most closely align the maximums and/or minimums in the image projections.

After step 104, offsets between the setup image and the runtime image for an inspection frame can be determined. The inspection frame and the runtime image may be the same size (e.g., 128×128 pixels or larger). Offsets between a design and the runtime image for the inspection frame also can be determined. Care areas can be placed on the runtime image based on an offset correction. Placement of the care area can be adjusted based on the compensation during offset correction. The offset correction can be based on the offsets between the setup image and the runtime image and/or the offsets between the design and the runtime image.

Figure 2:
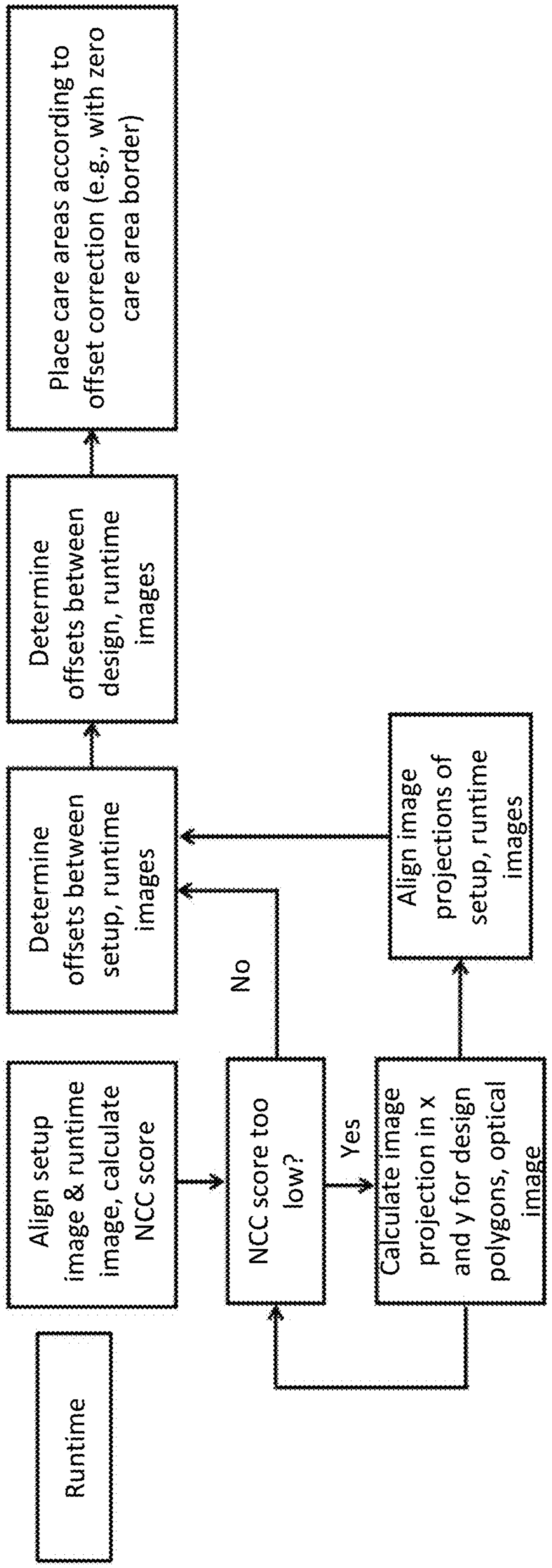
FIG. 2 is a flowchart of an embodiment of implementation of the method of FIG. 1 in accordance with the present disclosure.

An implementation of this PDA flow is shown FIG. 2. The setup process may remain the same. The NCC score is calculated after the initial PDA alignment is performed. Setup and runtime images can be aligned at each target. If the NCC score is too low, image projections in the x and y directions are calculated for the design polygons of the optical image or the setup optical image and runtime optical image. The projection peak locations of the two image projections are used to align the optical patch images (e.g., a runtime image) to the design or the setup optical image to the runtime optical image.

A zero care area border can be used in the x and y direction for the care areas that are placed. A care area border can be a way to extend the current care areas to compensate for alignment mistakes. A zero care area border means that there is high confidence that the alignment error is much smaller than the pixel size, which may be a result of the offset correction. If the care area alignment is not too far off, then the care area border can be set to zero.

Offsets between the setup and runtime images and/or a design and runtime images can be determined at each inspection frame.

The method 100 can be used to align an image with a design or to align two images. The images can be golden images, rendered images, or other runtime or setup images.

Figure 4:
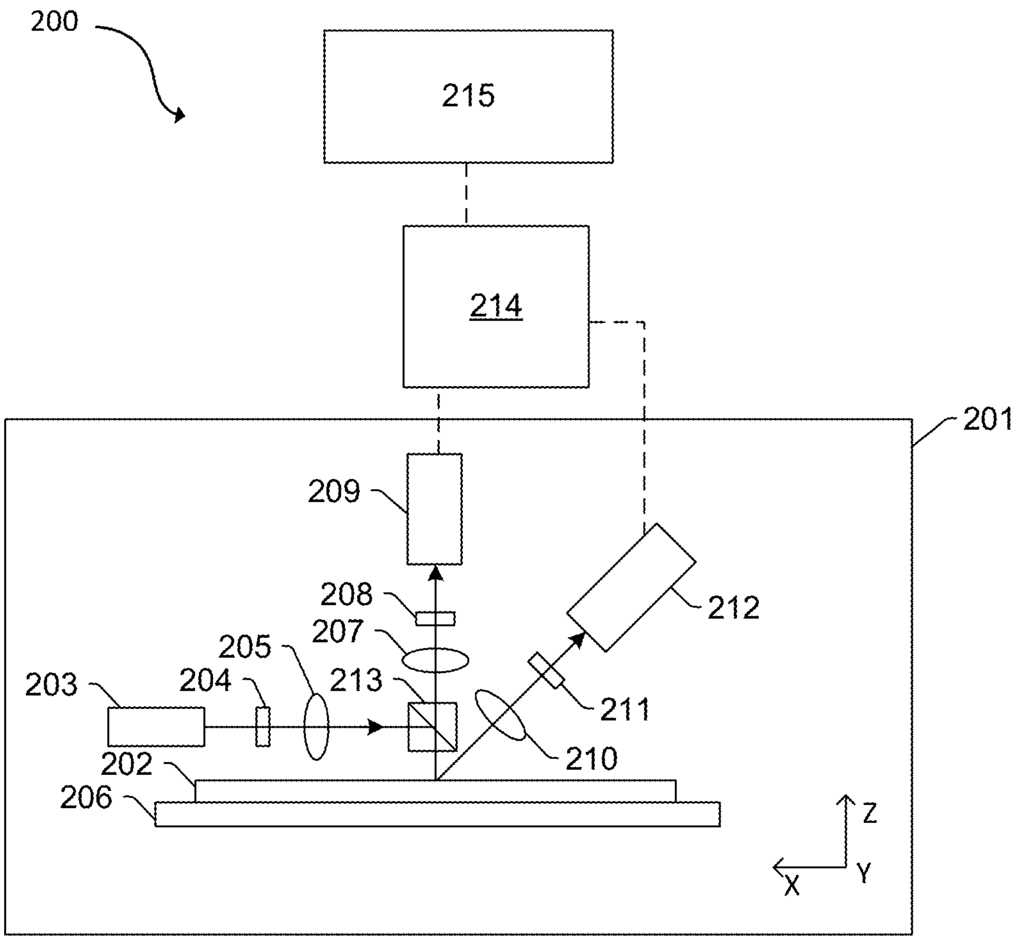
FIG. 4 is an embodiment of a system in accordance with the present disclosure.

One embodiment of a system 200 is shown in FIG. 4. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 4, optical based subsystem 201 includes an illumination subsystem configured to direct light to specimen 202. The illumination subsystem includes at least one light source. For example, as shown in FIG. 4, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 4, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 4. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 4 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 4) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 4 as a single refractive optical element, it is to be understood that, in practice, lens 205 may include a number of refractive and/or reflective optical elements that in combination focus the light from the optical element to the specimen. The illumination subsystem shown in FIG. 4 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 4 includes two detection channels, one formed by collector 207, element 208, and detector 209 and another formed by collector 210, element 211, and detector 212. As shown in FIG. 4, the two detection channels are configured to collect and detect light at different angles of collection. In some instances, both detection channels are configured to detect scattered light, and the detection channels are configured to detect light that is scattered at different angles from the specimen 202. However, one or more of the detection channels may be configured to detect another type of light from the specimen 202 (e.g., reflected light).

As further shown in FIG. 4, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 4 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 4 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 4 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane.

As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 4 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to perform embodiments of the method 100. The processor 214 can align a setup image to a runtime image at a target to form aligned images; determine a normalized cross-correlation score for the aligned images; determine an image projection in perpendicular x and y directions for design polygons; and align image projections for the setup image and the runtime image. The system 200 can be used to provide the setup image and the runtime image. In another instance, the system 200 can be used to provide the runtime image and the setup image is provided by another inspection system.

An additional embodiment relates to a non-transitory computer-readable medium storing program instructions executable on a controller for performing a computer-implemented method for classifying a wafer map, as disclosed herein. In particular, as shown in FIG. 4, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While the system 200 uses light, the method 100 can be performed using a different semiconductor inspection system. For example, the method 100 can be performed using results from a system that uses an electron beam, such as a scanning electron microscope, or an ion beam. Thus, the system can have an electron beam source or an ion beam source as the energy source instead of a light source.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:

aligning a setup image to a runtime image at a target using a processor thereby generating aligned images, wherein the setup image is a golden image or a reference image, and wherein the runtime image is an image generated during inspection;

determining, using the processor, a normalized cross-correlation score for the aligned images, wherein the normalized cross-correlation score measures a similarity of two types of data as a function of a displacement of one relative to another;

determining, using the processor, image projections in perpendicular x and y directions for polygons in each of the aligned images, wherein each of the image projections is a sum of grey level values along pixels in one of a column or row of one of the aligned images divided by a number of the pixels in the one of the column or row; and aligning, using the processor, corresponding ones of the image projections for the setup image and the runtime image in the perpendicular x and y directions.

2. The method of claim 1, further comprising, using the processor, determining offsets between the setup image and the runtime image for an inspection frame after aligning the image projections.

3. The method of claim 2, further comprising, using the processor, determining offsets between a design and the runtime image for the inspection frame.

4. The method of claim 3, further comprising placing care areas on the runtime image based on an offset correction using the processor.

5. The method of claim 1, wherein aligning the corresponding ones of the image projections includes:

determining projection peak locations for the polygons in the aligned images along the x direction;

adjusting at least one of the runtime image or the setup image so the projection peak locations overlap along the x direction;

determining projection peak locations for the polygons in the aligned images along the y direction; and adjusting at least one of the runtime image or the setup image so the projection peak locations overlap along the y direction.

6. A system comprising:

a stage configured to hold a semiconductor wafer;

an energy source configured to direct a beam at the semiconductor wafer on the stage;

a detector configured to receive the beam reflected from the semiconductor wafer on the stage; and a processor in electronic communication with the detector, wherein the processor is configured to:

align a setup image to a runtime image at a target thereby generating aligned images, wherein the setup image is a golden image or a reference image, and wherein the runtime image is an image generated during inspection;

determine a normalized cross-correlation score for the aligned images, wherein the normalized cross-correlation score measures a similarity of two types of data as a function of a displacement of one relative to another;

determine image projections in perpendicular x and y directions for polygons in each of the aligned images, wherein each of the image projections is a sum of grey level values along pixels in one of a column or row of one of the aligned images divided by a number of the pixels in the one of the column or row; and align corresponding ones of the image projections for the setup image and the runtime image in the perpendicular x and y directions.

7. The system of claim 6, wherein the energy source is a light source, and wherein the beam is a beam of light.

8. The system of claim 6, wherein the processor is further configured to determine offsets between the setup image and the runtime image for an inspection frame after the image projections are aligned.

9. The system of claim 8, wherein the processor is further configured to determine offsets between a design and the runtime image for the inspection frame.

10. The system of claim 9, wherein the processor is further configured to place care areas on the runtime image based on an offset correction.

11. The system of claim 6, wherein aligning the corresponding ones of the image projections includes:

determining projection peak locations for the polygons in the aligned images along the x direction;

adjusting at least one of the runtime image or the setup image so the projection peak locations overlap along the x direction;

determining projection peak locations for the polygons in the aligned images along the y direction; and adjusting at least one of the runtime image or the setup image so the projection peak locations overlap along the y direction.

12. A non-transitory computer-readable storage medium, comprising one or more programs for executing the following steps on one or more computing devices:

aligning a setup image to a runtime image at a target thereby generating aligned images, wherein the setup image is a golden image or a reference image, and wherein the runtime image is an image generated during inspection;

determining a normalized cross-correlation score for the aligned images, wherein the normalized cross-correlation score measures a similarity of two types of data as a function of a displacement of one relative to another;

determining image projections in perpendicular x and y directions for polygons in each of the aligned images, wherein each of the image projections is a sum of grey level values along pixels in one of a column or row of one of the aligned images divided by a number of the pixels in the one of the column or row; and aligning corresponding ones of the image projections for the setup image and the runtime image in the perpendicular x and y directions.

13. The non-transitory computer-readable storage medium of claim 12, wherein the steps further include determining offsets between the setup image and the runtime image for an inspection frame after aligning the image projections.

14. The non-transitory computer-readable storage medium of claim 13, wherein the steps further include determining offsets between a design and the runtime image for the inspection frame.

15. The non-transitory computer-readable storage medium of claim 14, wherein the steps further include placing care areas on the runtime image based on an offset correction.

16. The non-transitory computer-readable storage medium of claim 12, wherein the steps further include:

determining projection peak locations for the polygons in the aligned images along the x direction;

adjusting at least one of the runtime image or the setup image so the projection peak locations overlap along the x direction;

determining projection peak locations for the polygons in the aligned images along the y direction; and adjusting at least one of the runtime image or the setup image so the projection peak locations overlap along the y direction.

* * * * *